(12) United States Patent
Breuer et al.

(10) Patent No.: US 11,257,657 B2
(45) Date of Patent: Feb. 22, 2022

(54) CHARGED PARTICLE BEAM DEVICE WITH INTERFEROMETER FOR HEIGHT MEASUREMENT

(71) Applicant: ICT Integrated Circuit Testing Gesellschaft für Halbleiterprüftechnik mbH, Heimstetten (DE)

(72) Inventors: John Breuer, Munich (DE); Rony Reuveni, Gedera (IL); Alexander Goldenstein, Holon (IL)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 27 days.

(21) Appl. No.: 16/793,314

(22) Filed: Feb. 18, 2020

(65) Prior Publication Data

US 2021/0257182 A1    Aug. 19, 2021

(51) Int. Cl.
*H01J 37/22* (2006.01)
*G01B 11/06* (2006.01)
*H01J 37/28* (2006.01)
*H01J 37/26* (2006.01)

(52) U.S. Cl.
CPC .......... *H01J 37/22* (2013.01); *G01B 11/0608* (2013.01); *H01J 37/265* (2013.01); *H01J 37/28* (2013.01)

(58) Field of Classification Search
CPC .......... H01J 37/22; H01J 37/28; H01J 37/265; H01J 37/10; H01J 37/1471; H01J 37/244; H01J 2237/0492; H01J 2237/1501; G01B 11/0608; G01B 15/02
See application file for complete search history.

(56) References Cited

U.S. PATENT DOCUMENTS

| | | | | |
|---|---|---|---|---|
| 5,055,696 A | * | 10/1991 | Haraichi | H01J 37/228 250/492.2 |
| 6,765,217 B1 | * | 7/2004 | Nishimura | G01N 23/225 250/491.1 |
| 8,759,760 B2 | * | 6/2014 | Zeidler | H01J 37/28 250/306 |
| 2003/0053074 A1 | * | 3/2003 | Hill | B82Y 40/00 356/500 |
| 2005/0134865 A1 | * | 6/2005 | Schoonewelle | G03F 9/7011 356/601 |
| 2007/0252963 A1 | * | 11/2007 | Modderman | G03B 27/42 355/53 |
| 2010/0297562 A1 | * | 11/2010 | Shibazaki | H01L 21/6838 430/325 |
| 2020/0035452 A1 | * | 1/2020 | Bennahmias | H01J 37/04 |

* cited by examiner

*Primary Examiner* — Brooke Purinton
(74) *Attorney, Agent, or Firm* — Kilpatrick Townsend & Stockton LLP

(57) ABSTRACT

A method of operating a charged particle beam device is disclosed, including focusing a charged particle beam onto a sample with an objective lens assembly; passing a reflected light beam through a bore of the objective lens assembly to an interferometer; and interferometrically determining a z-position of the sample with the interferometer. A charged particle beam device is disclosed, including a charged particle beam generator which has a charged particle source. A charged particle path for the charged particle beam extends through a bore of an objective lens assembly toward a sample stage. An interferometer is arranged to receive a reflected light beam which passes through the bore of the objective lens assembly.

20 Claims, 5 Drawing Sheets

CHARGED PARTICLE BEAM DEVICE WITH INTERFEROMETER FOR HEIGHT MEASUREMENT

TECHNICAL FIELD

Embodiments described herein may relate to charged particle beam devices for use in inspection, defect detection, and/or critical dimensioning applications. Embodiments also may relate to a scanning charged particle beam device and a method of operation. Embodiments also may relate to methods of operating a charged particle beam device, such as a device that includes an interferometer to measure the position of a sample.

BACKGROUND

Charged particle beam devices have many uses, such as inspection of semiconductor devices with nanometer scale features. Modern semiconductor technology is highly dependent on an accurate control of the various processes used during the production of integrated circuits. Semiconductor wafers can be inspected by charged particle beam devices in order to detect problems. The inspection of wafers or masks for defects can include the examination of the whole wafer or mask area. Thus, there is a challenge to inspect a large area at high resolution. Also, it is desirable to perform inspection rapidly and accurately so that production throughput is not limited by the inspection process, if possible.

Scanning electron microscopes (SEM) have been used to inspect wafers. The surface of the wafer can be scanned using a finely focused electron beam. When the electron beam irradiates the wafer, secondary electrons and/or backscattered electrons, i.e. signal electrons, are generated and can be detected.

Wafer and mask defect inspection in semiconductor technology benefits from high resolution and fast inspection tools, which may cover full wafer/mask application and/or hot spot inspection. Electron beams can be used to provide high resolution inspection of samples so as to be able to detect small defects. In particular, from the 20 nm node and beyond, the high-resolution potential of electron beam based imaging tools is in demand to detect many defects of interest. The rapid and accurate acquisition of data from the sample surface, such as in the form of images, is aided by an accurate focus of the charged particle beam on the sample. Methods to provide a stable focus and/or a stable working distance between an objective lens assembly and sample are desirable.

SUMMARY

Herein is disclosed a method of operating a charged particle beam device, including focusing a charged particle beam onto a sample with an objective lens assembly; passing a reflected light beam through a bore of the objective lens assembly to an interferometer; and interferometrically determining a z-position of the sample with the interferometer.

Herein is disclosed a charged particle beam device comprising a charged particle beam generator including a charged particle source; a charged particle path for the charged particle beam which extends through a bore of an objective lens assembly toward a sample stage; and an interferometer arranged to receive a reflected light beam which passes through the bore of the objective lens assembly.

Embodiments are also directed at apparatuses for carrying out the disclosed methods and include apparatus parts for performing each described method features. The method features may be performed by way of hardware components, such as a computer and/or controller. The computer and/or controller may be configurable, programmable, configured, and/or programmed, such as by appropriate software. Furthermore, embodiments are also directed at methods which can be carried out by the described apparatus. Embodiments include method features for carrying out every function of the apparatus.

BRIEF DESCRIPTION OF THE DRAWINGS

So that the manner in which the above recited features can be understood in detail, a more particular description, briefly summarized above, may be had by reference to embodiments. The accompanying drawings relate to embodiments and are described in the following.

DETAILED DESCRIPTION

Figure 1:
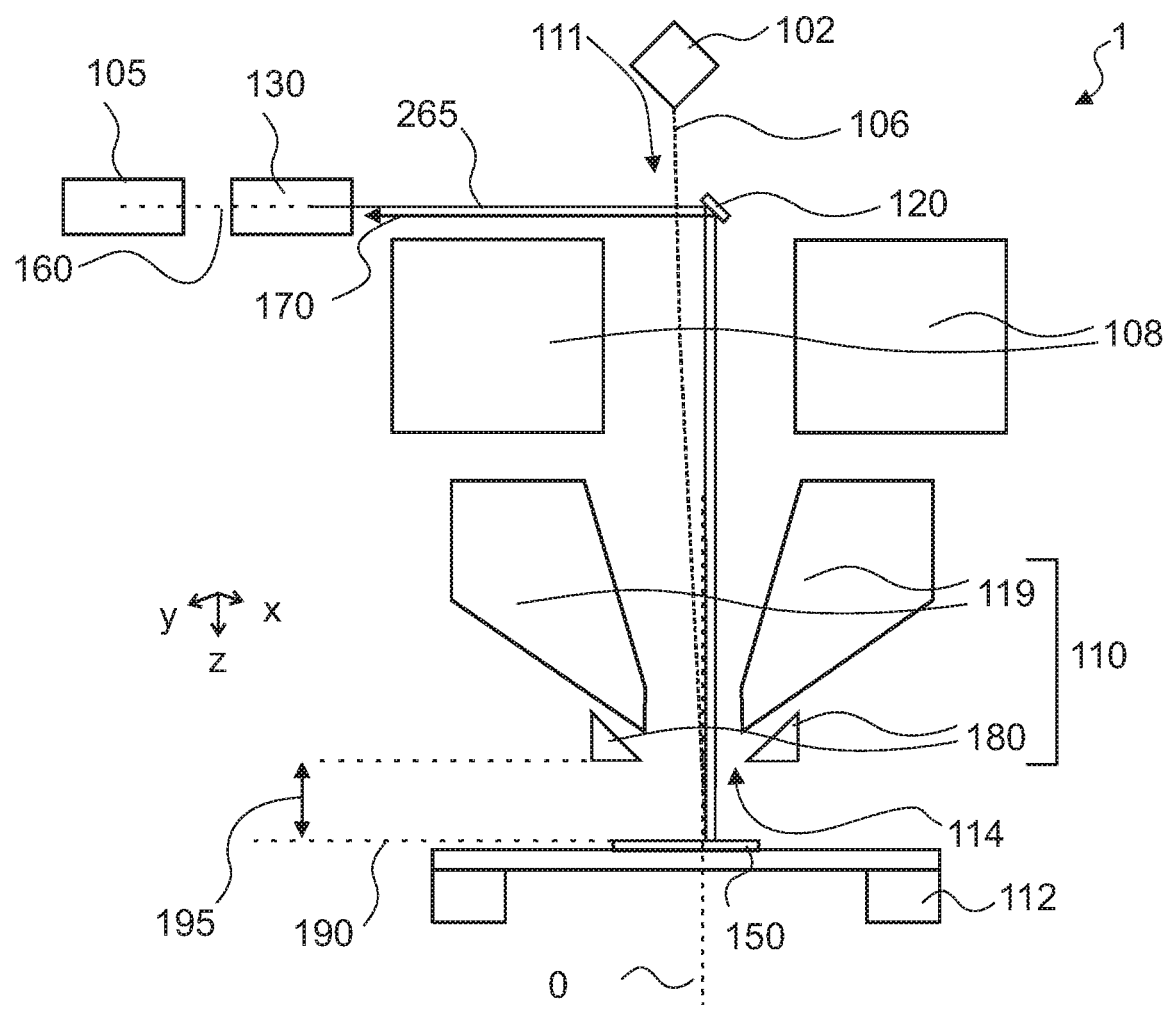
FIG. 1 shows a schematic drawing of a charged particle beam device according to embodiments described herein.

Reference will now be made in detail to the various embodiments, one or more examples of which are illustrated in the figures. Within the following description of the drawings, the same reference numbers refer to same components. The differences with respect to individual embodiments are described. Each example is provided by way of explanation and is not meant as a limitation. Further, features illustrated or described as part of one embodiment can be used on or in conjunction with other embodiments to yield yet a further embodiment. The description is intended to include the modifications and variations.

Without limiting the scope of protection of the present application, in the following, the charged particle beam device or components thereof can be referred to as a charged particle beam device, or "device," which may include components for the detection of secondary or backscattered particles, such as electrons. Embodiments can include apparatuses and components that may detect secondary and/or backscattered charged particles in the form of electrons, ions, photons, X-rays and/or other signals which may be used to obtain a specimen image. As described herein, discussions and descriptions relating to the detection are exemplarily described with respect to electrons in scanning electron microscopes. Other types of charged particles, e.g. positive ions, can be detected by the device in a variety of different instruments.

A "specimen" or "sample" as referred to herein, includes, but is not limited to, semiconductor wafers, semiconductor workpieces, photolithographic masks and other workpieces such as memory disks and the like. Embodiments may be applied to any workpiece on which material is deposited or which is structured. A specimen can include a surface to be structured or on which layers are deposited, an edge, and typically a bevel.

Herein "uv" and "ultraviolet" are used interchangeably.

Herein, the target distance of the objective lens assembly can be the distance between the front edge of the assembly and the plane of focus of the objective lens assembly; when a sample is in focus, the z-position of the sample can be at the target distance of the objective. The front edge of the objective lens assembly may be that of the focusing optics of the objective lens assembly; or a detector or other unit which is forward of the focusing optics of the objective lens assembly. Herein, the optical axis may refer to the optical axis of the objective lens assembly, and may be centered in a bore of the objective lens assembly.

Herein, a variable length path is described which refers to the variable length of a path of a light beam which is incident and then reflected. The variable length path may be understood to be part of the interferometer, even when the variable length path (and/or incident and reflected beams) are schematically shown to extend outside the boundary of the schematically indicated interferometer.

Herein coaxial and/or parallel beams, paths, and the like are described with the intent that usual deviations from geometrical perfection are understood. For example, coaxial beams and/or parallel beams may be an angle of up to 0.2°, 1°, 3°, or 5°.

FIG. 1 shows, according to an embodiment, a charged particle beam device 1, such as a scanning electron microscope. The charged particle beam device 1 can be used for sample inspection and/or lithography, for example. The device includes a charged particle beam generator 102 which has a charged particle source for generating charged particles such as electrons. A beam of charged particles can be generated by the source and accelerating optics. The charged particles are directed toward a sample 150 by a path 111. The charged particle path 111 for the charged particle beam 106 can extend through a bore 114 of an objective lens assembly 110 toward a stage 112. The objective lens assembly 110 can focus the charged particle beam 106 onto the sample 150. The device can include a light source 105 which can generate an initial light beam 160. The initial light beam 160 can be split with an interferometer 130 which can allow an incident light beam 265 to be directed to the sample 150. A mirror 120 may direct the incident beam toward the sample 150, such as through the bore 114 of the objective lens assembly 110.

The sample 150 may reflect the incident light beam 265 such that a reflected light beam 170 passes through the bore 114 of the objective lens assembly 110. The path of the reflected light beam 170 may overlap and/or be coaxial with at least part of the path of the incident light beam 265. The incident light beam 265 may be superimposed on the reflected light beam 170, particularly through the bore 114. The reflected and/or incident beam can travel a path that includes a working distance 195 between the front end of the objective lens assembly 110 and the z-position 190 of the sample 150. The working distance 195 can be variable, such as adjustable by movement of the stage 112.

The reflected light beam 170 can be received by the interferometer 130, particularly after the reflected light beam 170 passes through the bore 114 of the objective lens assembly 110 from the sample 150. The optical path of the incident light beam 265 and reflected light beam 170 can overlap, particularly between the sample 150 and the interferometer 130.

The device 1 depicted in FIG. 1 has an optional beam directing assembly 108 which can operate on the charged particle beam 106 such that there is alignment of the charged particle beam 106 and the incident light beam 265. For example, the mirror 120 may direct the incident beam directly along the optical axis 0 of the objective lens assembly 110, such as through the center of the bore 114. As depicted in FIG. 1, the charged particle beam 106 may propagate so as to avoid crossing the mirror 120.

The beam directing assembly 108 may direct the charged particles to pass through the bore 114 of the objective lens assembly 110, such as directly along the optical axis 0 of the objective lens assembly 110, and/or through the center of the bore 114.

Optionally, before passing through the beam directing assembly 108, the charged particle beam 106 propagates parallel to the optical axis 0 of the objective lens assembly 110. The beam directing assembly 108 may tilt the charged particle beam 106, as the beam 106 propagates alongside the incident light beam 265, such that the charged particle beam 106 propagates at an angle with respect to the optical axis 0 of the objective lens assembly 110. The incident light beam 265 may overlap the charged particle beam 106 in the objective lens assembly 110. In addition to the beam directing assembly 108, and in an embodiment which may be combined with any other embodiment, there may be a beam scanner which may be used for raster scanning and/or offsetting the charged particle beam 106.

As depicted in FIG. 1, the mirror 120 can be placed upstream from the beam directing assembly 108. The mirror 120 can be placed between the beam generator 102 and the beam directing assembly 108. The mirror 120 can be adjustable, such as to aid in aligning the light beam(s) and the charged particle beam 106. The incident light beam 265 can be aligned to propagate through the bore 114.

At the sample 150, the charged particle beam 106 and the incident light beam 265 may be within 1 mm of each other. Alternatively/additionally, the beams may overlap, such as strike the same spot.

The objective lens assembly 110 can focus the charged particle beam 106 onto the sample 150 and/or collect electrons from the sample 150 for imaging and/or detection. The objective lens assembly 110 may include focusing optics 119 for the charged particles and may optionally include a charged particle detector 180. The optional charged particle detector 180 may be at the front end of the objective lens assembly 110. The charged particle detector 180 may detect charged particles, for example photoelectrons generated by the incident light beam 265 and/or primary or secondary scattered charged particles (e.g. electrons) from the surface of the sample 150.

The charged particles of the charged particle beam 106 may pass through a bore 114 of the objective lens assembly 110. The bore 114 (which may be about 1 or 2 mm in diameter; or from 1 to 20 mm or 1 to 5 mm, such as about 5 mm, 10 mm, or 20 mm) may also pass the incident light beam 265 and/or reflected light beam 170. The objective lens assembly 110 may substantially redirect the path of the charged particles. The objective lens assembly 110 may have little or no effect on the path of the incident and/or reflected light beam 170. The incident light beam 265 may strike the sample 150 to generate the reflected light beam 170 which may reach the interferometer 130.

Figure 2:
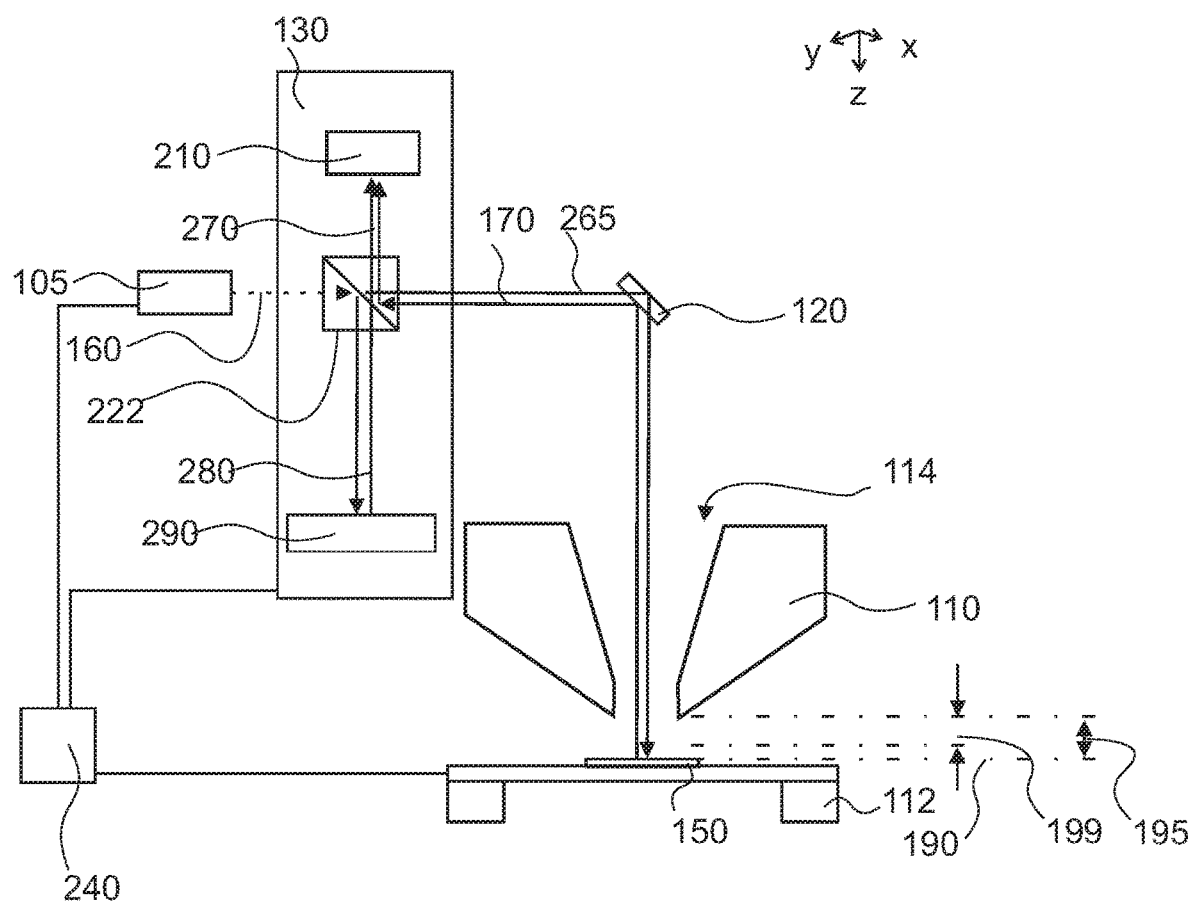
FIG. 2 illustrates schematically an interferometer in a charged particle device according to embodiments described herein.

FIG. 2 depicts, according to an embodiment, an interferometer 130 in a charged particle device 1. The device 1 can include a processor 240 which can determine a z-position 190 of the sample 150 and/or a working distance 195 between the front end of the objective lens assembly 110 and the sample 150, based on output from the interferometer 130. The processor 240 may be communicatively coupled to the interferometer 130 such as to a detector 210 thereof. The processor 240 may determine the z-position 190 and/or the working distance 195 based on the detector output. Alternatively/additionally, the processor 240 may be coupled to another position sensor of the stage 112, such as a capacitive height sensor. The stage 112 may have capacitive sensors for x, y, and/or z position which may augment the interferometric determination of z-position. The processor 240 may be coupled to capacitive sensors for x, y, and/or z-position and/or an actuator or actuators that move the stage 112 in x, y, and/or z.

Interferometric determination of z-position 190 and/or working distance 195 may allow for more precise focusing of the charged particle beam 106 and/or improve the stability of the sample focus. Interferometric determination may allow absolute and/or relative position measurements that do not require calibration, because, for example, the determination may be ultimately based on the wavelength of the incident light, e.g. laser wavelength.

The processor 240 may compare the working distance 195 to a target distance 199 of the objective lens assembly 110. The processor 240 may adjust the z-position 190 of the sample 150 based on at least one of the z-position 190, the working distance 195, and the target distance 199. The front end of the objective lens assembly 110 can be the front end of a charged particle detector 180 at the front end of the objective lens assembly 110.

The interferometer 130 can include a beamsplitter 222 for generating, from the initial light beam 160, an incident light beam 265 and a reference beam 280. The interferometer, particularly the detector 210 thereof, can receive light from a superimposed light beam 270 which includes the reflected light beam 170 and the reference beam 280. Detection of the superimposed light beam 270 can allow for the determination of the z-position 190 of the sample 150, and/or the working distance 195 between the objective lens assembly 110 and the sample 150. The superimposed light beam 270 may be formed at the beamsplitter 222 or at a second beamsplitter, for example.

The incident light beam 265 and the reflected light beam 170, in an embodiment, propagate along a path which can include the bore 114 and can extend between the bore 114 and the sample 150, which may be of variable length. The variable length path can include the working distance 195 between the front end of the objective lens assembly 110 and the z-position 190 of the sample 150. The variable length path can vary depending on a z-position 190 of the sample. Portions of the variable length path and the charged particle path can be shared. Such a shared path can include the path passing through the objective lens toward the sample. The shared path can be along the optical axis of the objective lens assembly, and the shared path can be coaxial to the optical axis.

The reference beam 280 can propagate along an arm of an interferometer 130, e.g. a Michelson interferometer, the arm optionally having a reference mirror 290 to reflect the reference beam 280 toward the detector 210. The arm may extend between the beamsplitter 222 and the reference mirror 290.

It is possible to modulate at least one of the light beams, e.g. at least one of the initial light beam 160, the incident light beam 265, the reflected light beam 170, the reference beam 280, and the superimposed light beam 270. The modulator can be an acoustooptic modulator, a chopper, and/or an oscillating mirror such as the reference mirror 290. Alternatively/additionally, the light source 105 may include a modulator, which may be controlled by the processor 240. Modulation may improve the signal/noise ratio and/or allow for determination of sample velocity. Alternatively/additionally, modulation may allow for heterodyning. For example, modulation may enable velocimetry. Laser velocimetry may not require calibration, which can be advantageous.

The light source 105 can be sufficient and/or adequate to generate photoelectrons and/or charge carriers by striking the sample (e.g. as the incident light beam 265). The light source can be partially absorbed by the sample. It may be desirable to simultaneously generate charge carriers and the reflected light beam 170 when the incident light beam 265 strikes the sample 150. For example, the light source 105 is an ultraviolet laser. The light source can be above the bandgap of the sample, e.g. above the bandgap of silicon. The light source can be above the work function of the sample, e.g. above the work function of silicon. The initial light beam 160 that is generated can be from a visible laser and/or infrared laser. It is may be desirable in other applications particularly to generate the reflected light beam 170 using a laser wavelength below the bandgap of the sample, e.g. an infrared laser. An infrared laser may avoid generating charge carriers and photoelectrons.

It is also possible to use, in addition to the light source 105, a second light source. The light source 105 may generate the incident light beam 265, and indirectly the reflected light beam 170. The second light source may generate an excitation beam which may be coaxial with the incident light beam 265 through the bore. The excitation beam may generate charge carriers and/or photoelectrons by absorption by the sample, while the light source 105 may be below the bandgap and not generate carriers and/or photoelectrons. The respective centers of the first and second light beams on the sample 150 may be offset, e.g. such that the excitation beam strikes the sample is aligned with the focus of the objective lens assembly 110.

In an embodiment, the beam directing assembly 108 may direct the charged particle beam 106 to be superimposed on the light path of the incident light beam 265 through the bore 114 of the objective lens assembly 110.

Figure 3:
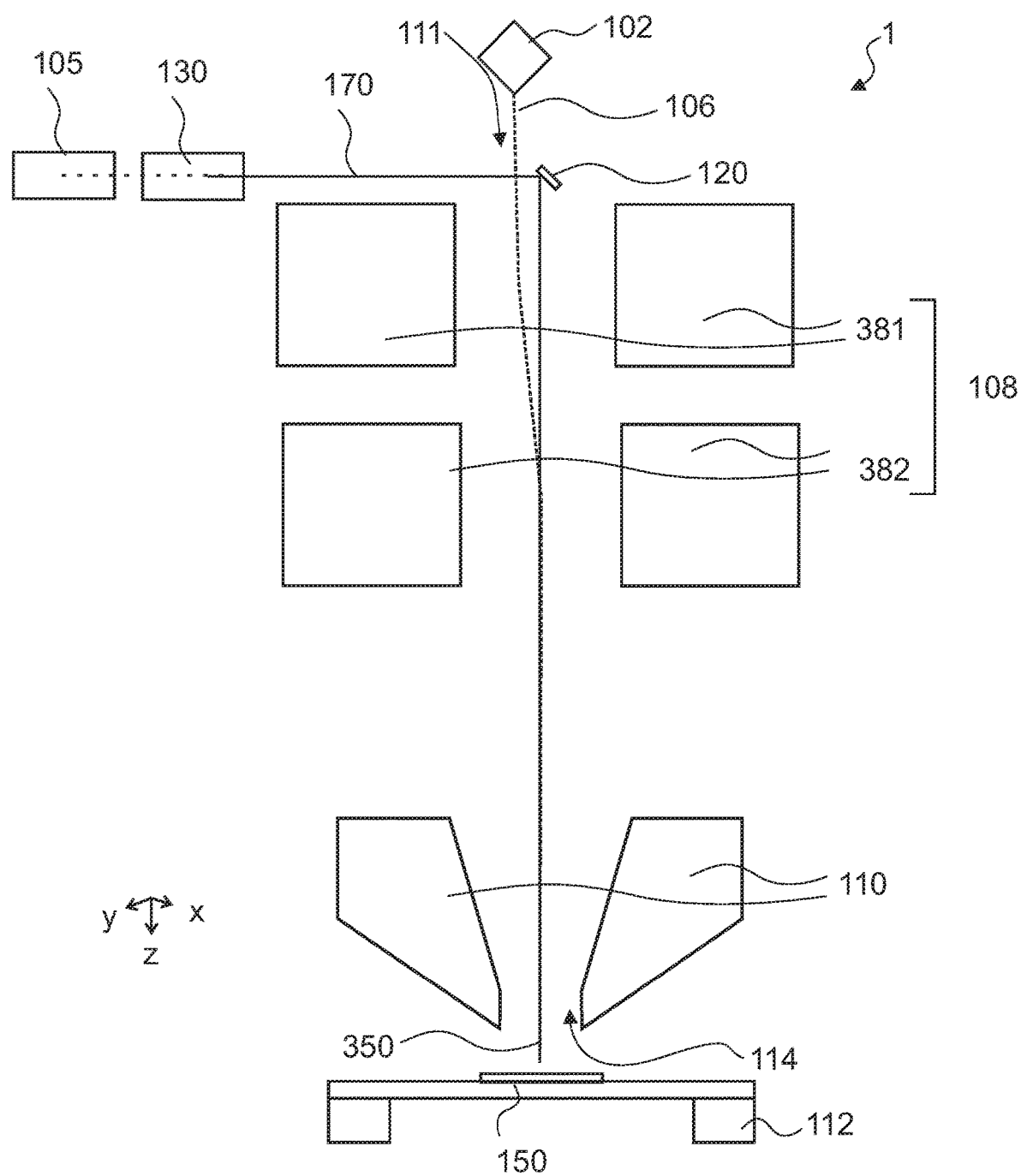
FIG. 3 shows a schematic drawing of a charged particle beam device according to embodiments described herein.

FIG. 3 shows, according to an embodiment, a charged particle beam device 1 which includes a beam directing assembly 108 with a first beam bender 381 and a second beam bender 382 of the beam directing assembly 108. The device 1 can have a plurality of beam benders. The mirror 120 can be upstream of the beam directing assembly 108 as shown. The mirror 120 can be between the beam benders. The charged particle path 111 can be parallel to the incident light beam 265 at the mirror 120. The first beam bender 381 can tilt the charged particle beam 106, as the beam 106 propagates alongside the incident light beam 265. The charged particle beam 106 can propagate at an angle with respect to the optical axis of the objective lens assembly 110 such as after the charged particle beam 106 passes through the first beam bender 381.

The charged particle beam can be subsequently corrected with a second beam bender 382 which is downstream of the first beam bender 381. After passing through the second beam bender 382, the charged particle beam 106 can propagate coaxially with the optical axis of the objective lens assembly 110. Optionally, the incident light beam 265 is coaxial with the optical axis of the objective lens assembly 110 after passing through the second beam bender 382.

Alternatively/additionally, the mirror 120, e.g. a beam mirror, may be between the first beam bender 381 and the second beam bender 382.

Figure 4:
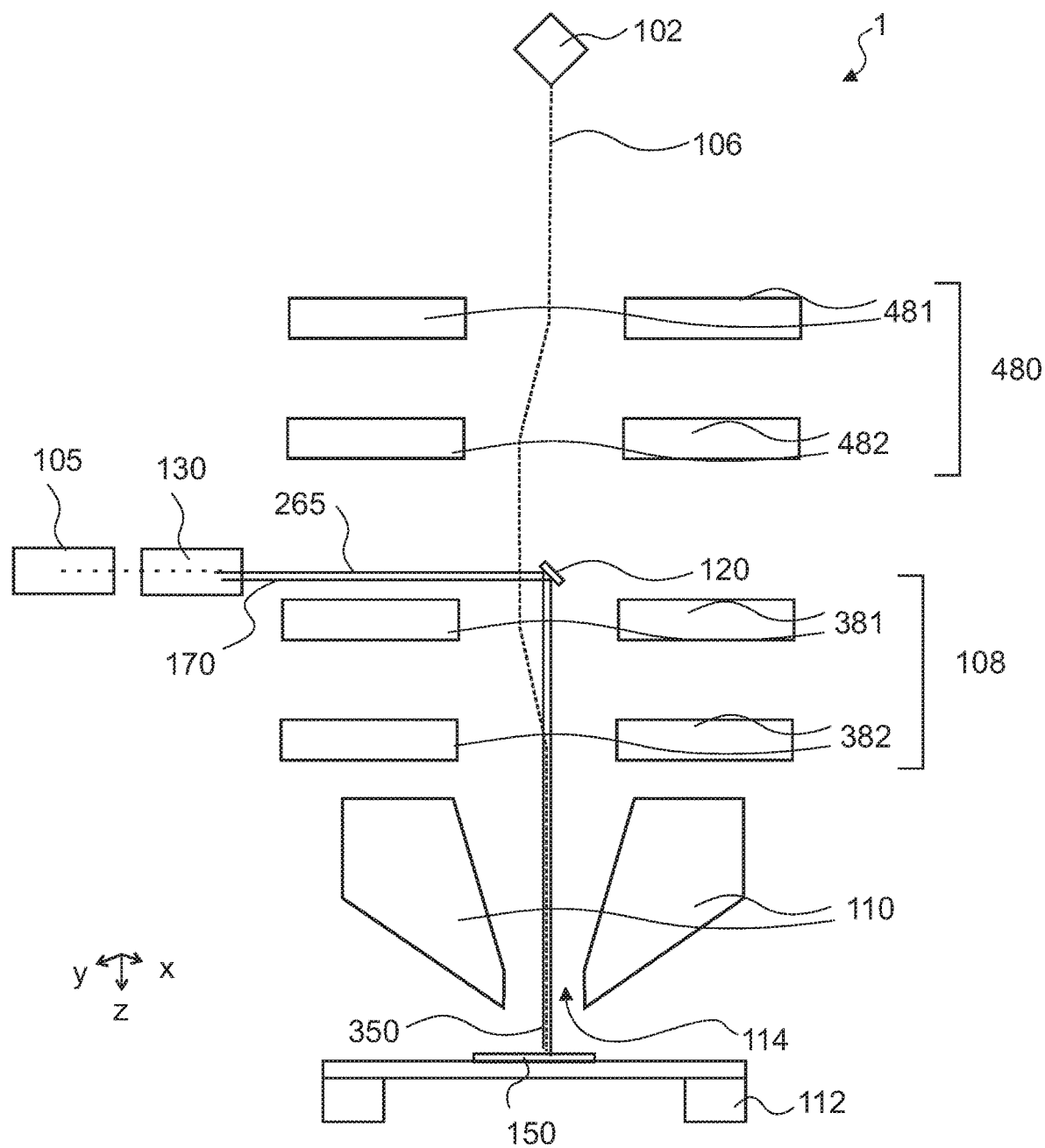
FIG. 4 shows a schematic drawing of a charged particle beam device according to embodiments described herein.

FIG. 4 shows, according to an embodiment, a charged particle beam device 1 which includes a beam directing assembly 108 with a first beam bender 381 and a second beam bender 382 of the beam directing assembly 108. The embodiment depicted in FIG. 4 also shows a beam offset assembly 480 which can have a third beam bender 481 and a fourth beam bender 482. The beam offset assembly 480 may operate on the charged particle beam 106 to make the beam 106 parallel to the incident light beam 265 and/or optical axis 0 of the objective lens assembly 110 while being laterally displaced (in x and/or y direction) from being coaxial.

The mirror 120 may be positioned between the offset assembly 480 and the beam directing assembly 108. Before the charged particle beam 106 reaches the beam offset assembly 480, the charged particle beam 106 may be substantially and/or nominally coaxial with the optical axis 0 of the objective lens assembly 110.

The offset assembly 480 can offset the charged particle beam 106 such that the beam 106 propagates parallel and noncoaxially to the optical axis 0 of the objective lens assembly 110. For example, the charged particle beam 106 is tilted with a third beam bender 481 such that the charged particle beam 106 propagates at an angle with respect to the optical axis 0 of the objective lens assembly 110; and the charged particle beam 106 may be subsequently corrected with a fourth beam bender 482 which is downstream of the third beam bender 481. At the mirror 120, the charged particle beam 106 may be parallel to and offset from the optical axis 0 of the objective lens assembly 110.

The offset assembly 480 may allow better control of the charged particle beam 106 and/or allow for easier alignment with the incident light beam 265. It may be desirable to have the charged particle beam 106 irradiate a spot of the sample where the incident light beam 265 strikes the sample 150. The spot irradiated by the charged particle beam 106 may be smaller than a beamwaist of the incident light beam 265 at the sample 150. Alternatively/additionally, the charged particle beam 106 may irradiate a spot displaced from the incident light beam 265 at the sample 150. Alternatively/additionally, the charged particle beam 106 may irradiate a spot within 1 mm of the focus of the incident light beam 265 on the sample 150.

In addition to the beam offset assembly 480 and/or beam directing assembly 108, the device 1 may include a scanner which may be for raster scanning the charged particle beam 106 across the sample 150.

An embodiment, which can be combined with any other embodiment, is envisioned in which there are two beam benders in an offset assembly and two beam benders in a beam directing assembly (as depicted in FIG. 4); and an optional beam scanner for raster scanning.

Figure 5:
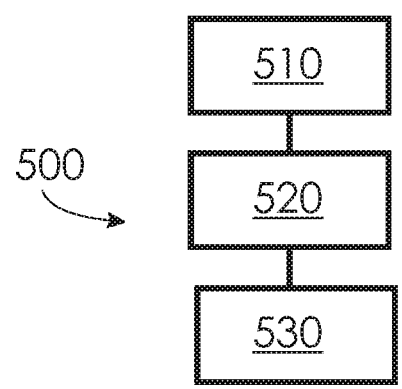
FIG. 5 illustrates a method of operating a charged scanning device, according to embodiments described herein.

FIG. 5 illustrates a method 500 of operating a charged scanning device, according to an embodiment described herein. The method can include focusing a charged particle beam onto a sample with an objective lens assembly (see operation 510); passing a reflected light beam through a bore of the objective lens assembly to an interferometer (see operation 520); and interferometrically determining a z-position of the sample with the interferometer (see operation 530).

By way of example, the following particularly enumerated embodiments are hereby disclosed:

Embodiment 1. A method (500) of operating a charged particle beam device (1), comprising:
  focusing (510) a charged particle beam (106) onto a sample with an objective lens assembly (110);
  passing (520) a reflected light beam (170) through a bore (114) of the objective lens assembly (110) to an interferometer (130);
  interferometrically (530) determining a z-position (190) of the sample (150) with the interferometer (130).

Embodiment 2. The method of operating a charged particle beam device of any previous enumerated embodiment, further comprising:
  passing an incident light beam (265) through the bore (114) of the objective lens assembly (110); and
  generating the reflected light beam (170) by reflecting the incident light beam (265) off the sample; and optionally
  directing the charged particle beam to irradiate a spot of the sample where the incident light beam strikes the sample; wherein optionally
  the spot is smaller than a beamwaist of the incident light at the sample; and optionally
  directing the charged particle beam to within 1 mm of the spot of the sample.

Embodiment 3. The method of operating a charged particle beam device of any previous enumerated embodiment, further comprising:
  determining a working distance (195) between a front end of the objective lens assembly and a surface of the sample (150) based on the z-position (190) of the sample; and optionally
  comparing the working distance (195) to a target distance (199) of the objective lens assembly (110); and optionally
  adjusting the z-position of the sample based on at least one of the z-position, the working distance, and the target distance; wherein optionally
  the front end of the objective lens assembly is the front end of a charged particle detector at the front end of the objective lens assembly.

Embodiment 4. The method of operating a charged particle beam device of any previous enumerated embodiment, further comprising:
  detecting the reflected light beam (170) and a reference beam (280) with a detector (210); further optionally comprising:
  superimposing the reflected light beam (170) and the reference beam (280) to form a superimposed light beam (270) which is detected for interferometrically determining the z-position (190) of the sample (150).

Embodiment 5. The method of operating a charged particle beam device of any previous enumerated embodiment, further comprising:
  creating an initial light beam (160) with a light source (105) such as a laser;
  splitting the light beam to form the incident light beam (265) and the reference beam, such as with a beamsplitter (222);
  directing the incident light beam (265) toward the objective lens assembly with a mirror (120), optionally through the center of the bore (114); wherein
  the mirror is optionally placed between beam benders of a beam directing assembly; wherein optionally
  the incident light beam (265) overlaps the particle beam 106 in the objective lens assembly; wherein optionally
  the incident light beam (265) and the particle beam 106 propagate, through the objective lens assembly, coaxially along the optical axis of the objective lens assembly (110); wherein optionally
the mirror is adjustable for alignment.

Embodiment 6. The method of operating a charged particle beam device of any previous enumerated embodiment, further comprising:
generating charged particles with a charged particle source;
generating the charged particle beam (106) from the charged particles;
directing the charged particles to pass though the bore (114) of the objective lens assembly (110) with a beam directing assembly (108);
optionally directing the charged particle beam (106) to propagate coaxially with the incident light beam (265) through the bore (114) of the objective lens assembly (110) with the beam directing assembly (108); furthermore optionally comprising directing the charged particle beam with a first beam bender (381) and a second beam bender (382) of the beam directing assembly (108); wherein optionally
the mirror (120) is upstream of the beam directing assembly (108) or between the first beam bender (381) and the second beam bender (382).

Embodiment 7. The method of operating a charged particle beam device of any previous enumerated embodiment, further comprising:
directing the charged particle beam, such as with the beam directing assembly (108), such that the charged particle beam is superimposed on the light path of the incident light beam through the bore of the objective lens assembly (110).

Embodiment 8. The method of operating a charged particle beam device of any previous enumerated embodiment, wherein
before passing through the beam directing assembly (108), the charged particle beam propagates parallel to the optical axis of the objective lens assembly (110); and
directing the charged particle beam (106) comprises operating on the charged particle beam with the beam directing assembly (108), including:
tilting the charged particle beam (106), as the charged particle beam 106 propagates alongside the incident light beam (265), with a first beam bender (381) of the beam directing assembly (108) such that the charged particle beam (106) propagates at an angle with respect to the optical axis of the objective lens assembly (110); and, optionally
correcting the charged particle beam with a second beam bender (382) which is downstream of the first beam bender (381) such that the charged particle beam (106) propagates coaxially with the optical axis of the objective lens assembly (110); and, optionally
the incident light beam (265) is coaxial with the optical axis of the objective lens assembly (110).

Embodiment 9. The method of operating a charged particle beam device of enumerated embodiment 8, further comprising:
offsetting, with an offset assembly (480) the charged particle beam such that the charged particle beam propagates parallel and noncoaxially to the optical axis of the objective lens assembly, including optionally:
tilting the charged particle beam (106) with a third beam bender (481) such that the charged particle beam (106) propagates at an angle with respect to the optical axis of the objective lens assembly (110); and
correcting the charged particle beam with a fourth beam bender (482) which is downstream of the third beam bender (481) such that the charged particle beam (106) propagates coaxially with the optical axis of the objective lens assembly (110); and offset from the optical axis of the objective lens assembly; wherein optionally
the mirror (120) is between the offset assembly (480) and the beam directing assembly (108).

Embodiment 10. The method of operating a charged particle beam device of any previous enumerated embodiment, further comprising:
modulating at least one of the initial light beam, the incident light beam, the reflected light beam, the reference beam, the position of the reference mirror, and the position of the stage; optionally modulating with an acoustooptic modulator and/or vibrating reference mirror.

Embodiment 11. The method of operating a charged particle beam device of any preceding enumerated embodiment, further comprising:
generating photoelectrons and/or charge carriers by striking the sample with the light beam.

Embodiment 12. The method of operating a charged particle beam device of any preceding enumerated embodiment, further comprising:
generating the initial light beam with a laser such as a UV, visible, or infrared laser.

Embodiment 13. A charged particle beam device (1) comprising:
a charged particle beam generator (102) including a charged particle source;
a charged particle path (111) for the charged particle beam (106) which extends through a bore (114) of an objective lens assembly toward a stage (112); and
an interferometer (130) arranged to receive a reflected light beam (170) which passes through the bore (114) of the objective lens assembly (110).

Embodiment 14. The charged particle beam device (1) of enumerated embodiment 13, further comprising:
a processor (240) for determining a z-position of a sample (150) based on output from the interferometer (130); and
a mirror arranged to direct the incident beam toward the sample, through the center of the bore, optionally coaxial to the optical axis of the objective lens assembly;
wherein the mirror is optionally adjustable; and wherein optionally, the optical axis of the objective lens assembly passes through the center of the bore.

Embodiment 15. The charged particle beam device (1) of enumerated embodiment 13 or 14, further comprising:
a light source for generating an initial light beam; and wherein
the interferometer (113) includes:
a beamsplitter for generating, from the initial light beam, an incident light beam and a reference beam;
a detector arranged to receive light from a superimposed beam which includes a reflected beam and the reference beam; and
a variable length path for the incident light beam and the reflected beam, the variable length path extending through the bore; wherein
the variable length path varies depending on a z-position of the sample;
wherein optionally a shared path is a portion of the variable length path and the charged particle path which passes through the objective lens toward the sample; wherein optionally the shared path is along the optical axis of the objective lens assembly, and
the shared path is coaxial to the optical axis; wherein optionally
the reference beam propagates along an arm of a Michelson interferometer,
the arm optionally having a reference mirror to reflect the reference beam toward the detector.

Embodiment 16. The charged particle beam device (1) of any of enumerated embodiments 13-15, further comprising a modulator to modulate at least one of the initial light beam, the incident beam, the reflected beam, the reference beam, and the superimposed beam, the modulator optionally being an acoustooptic modulator, a chopper, or an oscillating mirror such as the reference mirror.

Embodiment 17. The charged particle beam device (1) of any of enumerated embodiments 13-16, further comprising
a beam directing assembly (108) which optionally includes a first beam bender and a second beam bender; and optionally
a beam offset assembly which optionally includes a third beam bender and a fourth beam bender; wherein
the mirror is placed between the first and second beam benders, or
the mirror is placed between the beam offset assembly and the beam directing assembly.

Embodiment 18. The charged particle beam device (1) of any of enumerated embodiments 15-17, wherein
the light source is a laser, such as an infrared laser, uv laser, or visible laser; wherein
the laser wavelength is optionally below the bandgap of the sample, or optionally above the bandgap of the sample such as above the work function of the sample;
for example, the laser wavelength is sufficient to create charge carriers in silicon; wherein optionally
the laser is sufficient to create photoelectrons.

Embodiment 19. The charged particle beam device (1) of any of enumerated embodiments 13-18, further comprising:
a second light source which generates an excitation beam which may be coaxial with the incident light beam through the bore and may generate charge carriers and/or photoelectrons by absorption by the sample.

While the foregoing is directed to embodiments of the disclosed device and method of operation, other and further embodiments of the disclosure may be devised without departing from the basic scope thereof, and the scope thereof is determined by the claims that follow.

The invention claimed is:

1. A method of operating a charged particle beam device, comprising:
focusing a charged particle beam onto a sample with an objective lens assembly;
passing a reflected light beam through a bore of the objective lens assembly to an interferometer; and
interferometrically determining a working distance between the front end of the objective lens assembly and the sample based on output from the interferometer, wherein the charged particle beam device comprises another stage position sensor for augmenting said interferometric determination.

2. The method of operating a charged particle beam device of claim 1, further comprising:
passing an incident light beam through the bore of the objective lens assembly; and
generating the reflected light beam by reflecting the incident light beam off the sample; and
directing the charged particle beam to irradiate a spot of the sample where the incident light beam strikes the sample; wherein the spot is smaller than a beamwaist of the incident light beam at the sample; and
directing the charged particle beam to within 1 mm of a focus of the incident light beam on the sample.

3. The method of operating a charged particle beam device of claim 1, further comprising:
comparing the working distance to a target distance of the objective lens assembly; and
adjusting the z-position of the sample based on at least one of the working distance and the target distance.

4. The method of operating a charged particle beam device of claim 2, further comprising:
detecting the reflected light beam and a reference beam with a detector; and
superimposing the reflected light beam and the reference beam to form a superimposed light beam which is detected for the interferometric determination.

5. The method of operating a charged particle beam device of claim 4, further comprising:
generating an initial light beam with a light source which is a laser;
splitting the initial light beam to form the incident light beam and the reference beam with a beamsplitter;
directing the incident light beam toward the objective lens assembly with a mirror through a center of the bore; wherein
the mirror is placed between beam benders of a beam directing assembly; wherein
the incident light beam overlaps the charged particle beam in the objective lens assembly; wherein
the incident light beam and the charged particle beam propagate, through the objective lens assembly, coaxially along an optical axis of the objective lens assembly; and wherein
the mirror is adjustable for alignment.

6. The method of operating a charged particle beam device of claim 5, further comprising:
generating charged particles with a charged particle source;
generating the charged particle beam from the charged particles;
directing the charged particles to pass though the bore of the objective lens assembly with a beam directing assembly;
directing the charged particle beam to propagate coaxially with the incident light beam through the bore of the objective lens assembly with the beam directing assembly;
directing the charged particle beam with a first beam bender and a second beam bender of the beam directing assembly; and wherein
the mirror is upstream of the beam directing assembly or between the first beam bender and the second beam bender.

7. The method of operating a charged particle beam device of claim 2, further comprising:
directing the charged particle beam with a beam directing assembly, such that the charged particle beam is superimposed on a light path of the incident light beam through the bore of the objective lens assembly.

8. The method of operating a charged particle beam device of claim 6, wherein before passing through the beam directing assembly, the charged particle beam propagates parallel to the optical axis of the objective lens assembly; and directing the charged particle beam comprises operating on the charged particle beam with the beam directing assembly, including:

tilting the charged particle beam, as the charged particle beam propagates alongside the incident light beam, with a first beam bender of the beam directing assembly such that the charged particle beam propagates at an angle with respect to the optical axis of the objective lens assembly; and correcting the charged particle beam with a second beam bender which is downstream of the first beam bender such that the charged particle beam propagates coaxially with the optical axis of the objective lens assembly; and, the incident light beam is coaxial with the optical axis of the objective lens assembly.

9. The method of operating a charged particle beam device of claim 8, further comprising:

offsetting, with an offset assembly the charged particle beam such that the charged particle beam propagates parallel and noncoaxially to the optical axis of the objective lens assembly, including:

tilting the charged particle beam with a third beam bender such that the charged particle beam propagates at an angle with respect to the optical axis of the objective lens assembly; and correcting the charged particle beam with a fourth beam bender which is downstream of the third beam bender such that the charged particle beam propagates coaxially with the optical axis of the objective lens assembly; and offset from the optical axis of the objective lens assembly; and wherein the mirror is between the offset assembly and the beam directing assembly.

10. The method of operating a charged particle beam device of claim 4, further comprising:

modulating at least one of an initial light beam, the incident light beam, the reflected light beam, the reference beam, a position of a reference mirror, and a position of a stage; and wherein the modulating is with an acoustooptic modulator and/or oscillating reference mirror.

11. The method of operating a charged particle beam device of claim 1, further comprising:

generating photoelectrons and/or charge carriers by striking the sample with an incident light beam.

12. The method of operating a charged particle beam device of claim 1, further comprising:

generating an initial light beam with a laser.

13. A charged particle beam device comprising:

a charged particle beam generator including a charged particle source;

a charged particle path for a charged particle beam which extends through a bore of an objective lens assembly toward a stage;

an interferometer arranged to receive a reflected light beam which passes through the bore of the objective lens assembly;

a processor for determining a working distance between the front end of the objective lens assembly and the sample based on output from the interferometer; and another position sensor of the stage for augmenting said interferometric determination.

14. The charged particle beam device of claim 13, further comprising:

a mirror arranged to direct an incident beam toward the sample, through a center of the bore, optionally coaxial to an optical axis of the objective lens assembly;

wherein the mirror is adjustable; and wherein the optical axis of the objective lens assembly passes through the center of the bore.

15. The charged particle beam device of claim 13, further comprising:

a light source for generating an initial light beam; and wherein the interferometer includes:

a beamsplitter for generating, from the initial light beam, an incident light beam and a reference beam;

a detector arranged to receive light from a superimposed beam which includes a reflected beam and the reference beam; and a variable length path for the incident light beam and the reflected beam, the variable length path extending through the bore; wherein the variable length path varies depending on a z-position of a sample;

wherein a shared path is a portion of the variable length path and the charged particle path which passes through the objective lens assembly toward the sample; wherein the shared path is along an optical axis of the objective lens assembly, and the shared path is coaxial to the optical axis; and wherein the reference beam propagates along an arm of the interferometer, the arm optionally having a reference mirror to reflect the reference beam toward the detector.

16. The charged particle beam device of claim 15, further comprising a modulator to modulate at least one of the initial light beam, the incident light beam, the reflected beam, the reference beam, and a superimposed beam, the modulator being an acoustooptic modulator, a chopper, or an oscillating mirror which is the reference mirror.

17. The charged particle beam device of claim 13, further comprising:

a beam directing assembly which includes a first beam bender and a second beam bender, the beam directing assembly configured to operate on the charged particle beam; and a beam offset assembly which includes a third beam bender and a fourth beam bender, the beam offset assembly configured to operate on the charged particle beam; and wherein a mirror is placed between the first and second beam benders, or a mirror is placed between the beam offset assembly and the beam directing assembly.

18. The charged particle beam device of claim 15, wherein the light source is a laser; and wherein a laser wavelength is below a bandgap of the sample, or above the bandgap of the sample.

19. The charged particle beam device of claim 18, wherein the laser has a wavelength sufficient to generate charge carriers and/or photoelectrons in silicon.

20. The charged particle beam device of claim 18, further comprising a second light source which generates an excitation beam which is coaxial with the incident light beam through the bore and generates charge carriers and/or photoelectrons by absorption by the sample.

* * * * *